United States Patent [19]

Kiyama et al.

[11] Patent Number: 5,399,199
[45] Date of Patent: Mar. 21, 1995

[54] APPARATUS FOR GAS SOURCE MOLECULAR BEAM EPITAXY

[75] Inventors: Hiromi Kiyama; Kenji Okumura; Hidehiko Oku, all of Osaka, Japan

[73] Assignee: Daidousanso Co., Ltd., Osaka, Japan

[21] Appl. No.: 44,614

[22] Filed: Apr. 9, 1993

Related U.S. Application Data

[63] Continuation of Ser. No. 864,764, Apr. 7, 1992, Pat. No. 5,252,131.

[30] Foreign Application Priority Data

Feb. 27, 1992 [JP] Japan .................................. 4-078243

[51] Int. Cl.⁶ ............................................. C23C 16/00
[52] U.S. Cl. ..................................... 118/719; 118/725
[58] Field of Search ................................. 118/719, 725

[56] References Cited

U.S. PATENT DOCUMENTS

| | | | |
|---|---|---|---|
| 4,492,852 | 1/1985 | Finegan et al. | 118/725 |
| 4,838,201 | 6/1989 | Fraas et al. | 118/725 |
| 4,979,465 | 12/1990 | Yoshino et al. | 118/725 |
| 4,989,543 | 2/1991 | Schmitt | 118/725 |
| 5,033,407 | 7/1991 | Mizuno et al. | 118/715 |
| 5,107,791 | 4/1992 | Hirokawa et al. | 118/719 |
| 5,284,521 | 2/1994 | Aketagawa | 118/725 |

FOREIGN PATENT DOCUMENTS 1-278715 11/1989 Japan .

Primary Examiner—Richard Bueker
Attorney, Agent, or Firm—Armstrong, Westerman, Hattori, McLeland & Naughton

[57] ABSTRACT

This invention relates to an apparatus wherein a vacuum chamber is divided into two spaces, the substrate heating space and the crystal growth space, so that the degree of vacuum in the substrate heating space is set lower than the pressure for the Si growth and the degree of vacuum in the crystal space is set corresponding to the pressure for Si growth to thereby grow Si based semiconductor with excellent reproducibility over a long period. Moreover, heat efficiency toward the substrate is heightened by enclosing the upside and the circumference of the heating means with the heat shielding body to cut energy cost.

1 Claim, 3 Drawing Sheets

APPARATUS FOR GAS SOURCE MOLECULAR BEAM EPITAXY

This is a continuation of U.S. patent application Ser. No. 07/864,764, filed Apr. 7, 1992, now U.S. Pat. No. 5,252,131.

FIELD OF THE INVENTION

This invention relates to an apparatus for gas source molecular beam epitaxy wherein constitutive atoms or moleculars of crystal are supplied in a gaseous state to a substrate in an ultra-high vacuum state to thereby cause growth of a crystal thin film by adsorbing them on the substrate surface and thermal cracking, which is particularly suitable for producing Si based crystal film.

BACKGROUND OF THE INVENTION

As an method for producing a semiconductor device, there is known conventionally molecular beam epitaxy (MBE) process which comprises causing solid raw material to be evaporated using a heater, electric beam and the like, and depositing the obtained vapor on a substrate in an ultra-high vacuum chamber made of stainless steel to thereby cause growth of crystal. However, because of the use of the solid material, vacuum condition of the vacuum chamber has to be released for replenishment of the material every time the material is used up, and it takes long time to put the inside of the vacuum chamber back to the ultra-high vacuum condition again, which intermits growth of crystal film to cause unevenness of crystal film quality. These are disadvantages of this method.

Therefore, a process which comprises supplying constitutive material of crystal in a gaseous state (gas source MBE) has been tried recently in order to remove the above-mentioned disadvantages. In this method, an apparatus provided by a principle as shown in FIG. 4 is employed, for example. That is, in the center portion of a vacuum chamber 1 of the apparatus, a heater 6 is hung from the top and a substrate holder 5 pasted with a substrate 2 with indium and the like is set below the heater 6. And plural kinds of gasses are supplied at the same time through material gas feeding pipes 9 and 10 positioned down below with heating the above-mentioned substrate holder 5 and substrate 2 by radiant heat to thereby be deposited on the reference numeral 2a (a surface of the substrate 2) and cause growth of crystal. The reaction is ordinarily put in practice at high vacuum of about $10^{-4}$ to $10^{-6}$ Torr, and vacuum drawing is conducted by a vacuum pump (not shown) communicating with a vacuum pipe 8. Because material can be supplied continuously in this method, release of vacuum condition is not required for replenishment of material as is used to be, so that high quality crystal thin film can be obtained in short time.

The above-mentioned gas source MBE process has no problem for producing compound semiconductor such as GaAs, InP, and the like. However, for producing Si based semiconductor such as Si, SiGe, and the like, it is found that reproducibility of crystal growth is damaged because Si begins to accumulate on the heater 6 and the substrate holder 5 when the pressure for Si crystal growth in the vacuum chamber 1 reaches about $10^{-5}$ Torr and Si accumulates radically at the vacuum of around $10^{-4}$ Torr, which is suitable pressure for crystal growth of Si, to hinder radiating heat from the heater. Also Si requires the temperature over 1100° C. for film production and needs much more calorie than Ga (Film production temperature is 700° C.) does. Particularly, heat efficiency of silicon wafer is even worse because of its high heat transmissivity. Therefore, the improvement of heat efficiency of the previous apparatus is strongly desired.

It is accordingly an object of the invention to provide an improved apparatus for gas source molecular beam epitaxy with excellent heat efficiency while no accumulation of Si appears on the heater and the like during production of Si based semiconductor.

SUMMARY OF THE INVENTION

In accordance with the invention, the above-mentioned object can be accomplished by providing an apparatus for gas source molecular beam epitaxy comprising a vacuum chamber capable of being set at high vacuum, a substrate installed in almost the center of the inside of said vacuum chamber, a means to heat the substrate by radiant heat from one side of the installed substrate, and a means to supply gas toward the substrate from the other side of the substrate for forming crystal film, wherein a separator set around said substrate which divides the inside of the vacuum chamber into two spaces, a space for heating the substrate and a space for growing crystal epitaxially, a means to evacuate those two spaces separately, a heat shielding body for enclosing the upside and the circumference of the heating means, and a means to move the heat shielding body toward or backward the substrate are disposed.

DETAILED DESCRIPTION OF THE INVENTION

Inventors of the present invention investigated a cause of the Si accumulation on the heater at the degree of around $10^{-4}$ Torr in a vacuum chamber, and found out that Si accumulated when partial pressure of Si went high according as degree of vacuum came down because of low vapor pressure of Si at the temperature for crystal growth (about 500 to 1000° C.) compared with that of GaAs, InP, and the like. In order to prevent Si from accumulating on parts other than the substrate with holding the vacuum of $10^{-4}$ Torr which is suitable pressure for crystal growth of Si, an atmosphere around the heater should be set at high vacuum not to deposit Si, and an atmosphere touching the crystal growth side of the substrate should be kept around $10^{-4}$ Torr. Based on this conception, an apparatus was developed wherein a vacuum chamber was divided into two spaces by a separator set at the circumference of the substrate and evacuation could be conducted in each space separately. And, as to the apparatus, it was found that heating by the heater could be centralized toward the substrate by enclosing the upside and the circumference of the heater with a heat shielding body, which improved heat efficiency drastically, and the invention was attained.

The following mode for carrying out the invention illustrates the invention in detail.

EXAMPLE

Figure 1:
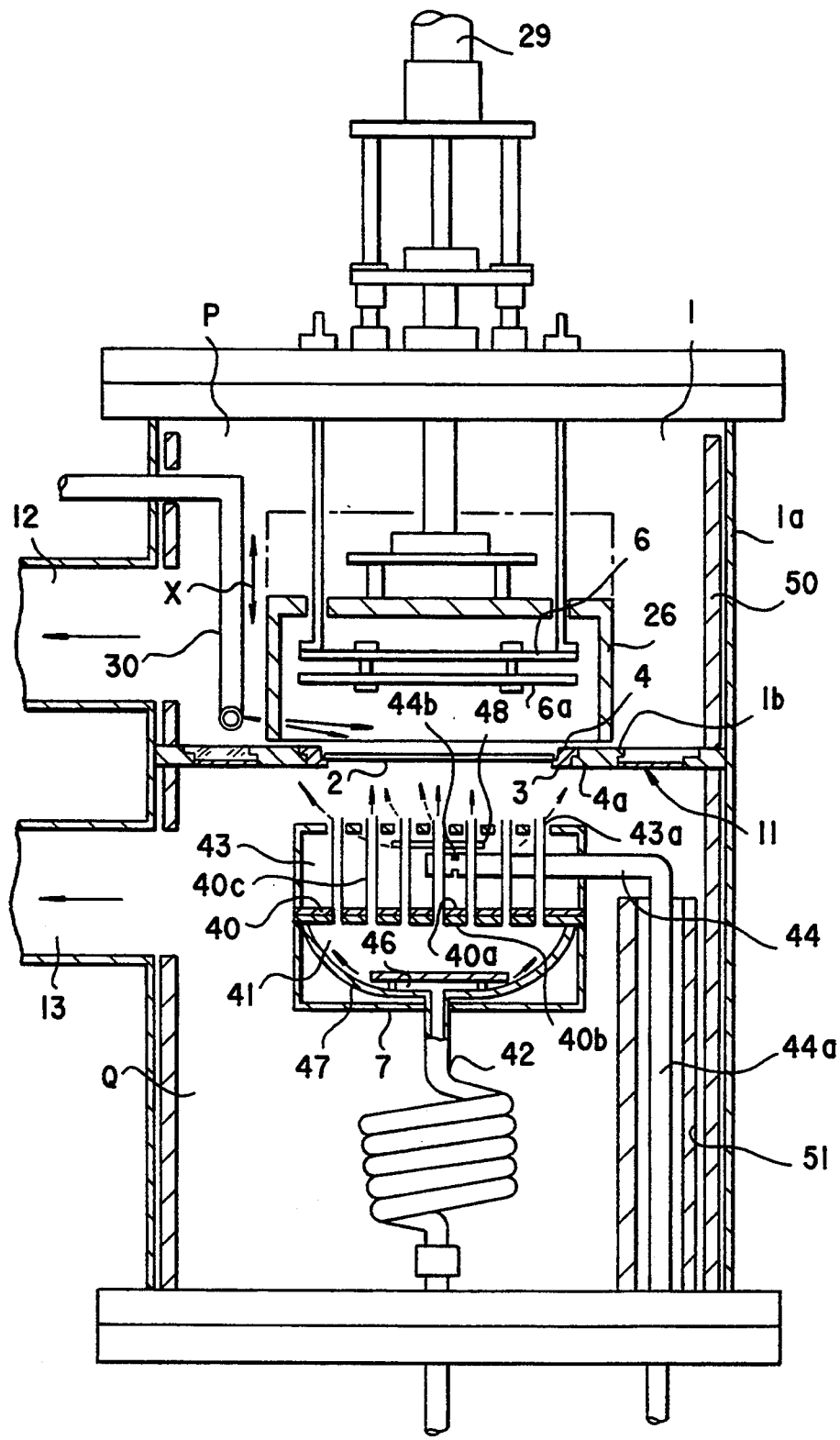
FIG. 1 shows a longitudinal-sectional view of an example of the present invention.

FIG. 1 shows a longitudinal-sectional view of one example of the present invention. This apparatus for gas source molecular beam epitaxy includes a cylindrical vacuum chamber 1 made of stainless steel. A disc shaped substrate 2 is placed horizontally, via a ring formed silicon plate (not shown) on an edge 3 of central opening of a substrate holding tray 4 disposed horizontally in the vacuum chamber 1 and the substrate is removably disposed therein. The silicon plate ring makes it possible to heat the whole substrate 2 uniformly. The substrate 2 disposed approximately in the center of the vacuum chamber 1 is replaced with a new substrate after treatment by a means (not shown) for replacing substrate disposed at an opening-closing portion (not shown) of a surrounding wall of the vacuum chamber 1. A separator 11 in almost a ring form is installed at a clearance between a peripheral edge 4a of the tray 4 and a guiding ring 1b made of stainless steel protruding horizontally inward from a surrounding wall 1a of the vacuum chamber 1 in order to fill the clearance.

The ring-like separator 11 comprises an inside peripheral ring portion and an outside peripheral ring portion. The inside peripheral portion is a carbon ring 20 and the outside peripheral portion is a quartz ring 21. As the quartz ring 21 has a good heat shielding effect, it prevents the part positioned outside the substrate 2 from getting too hot from the center of the substrate 2 toward the outside direction by heating for a film formation, and cuts off heat transfer to the surrounding wall 1a of the vacuum chamber 1.

Figure 3:
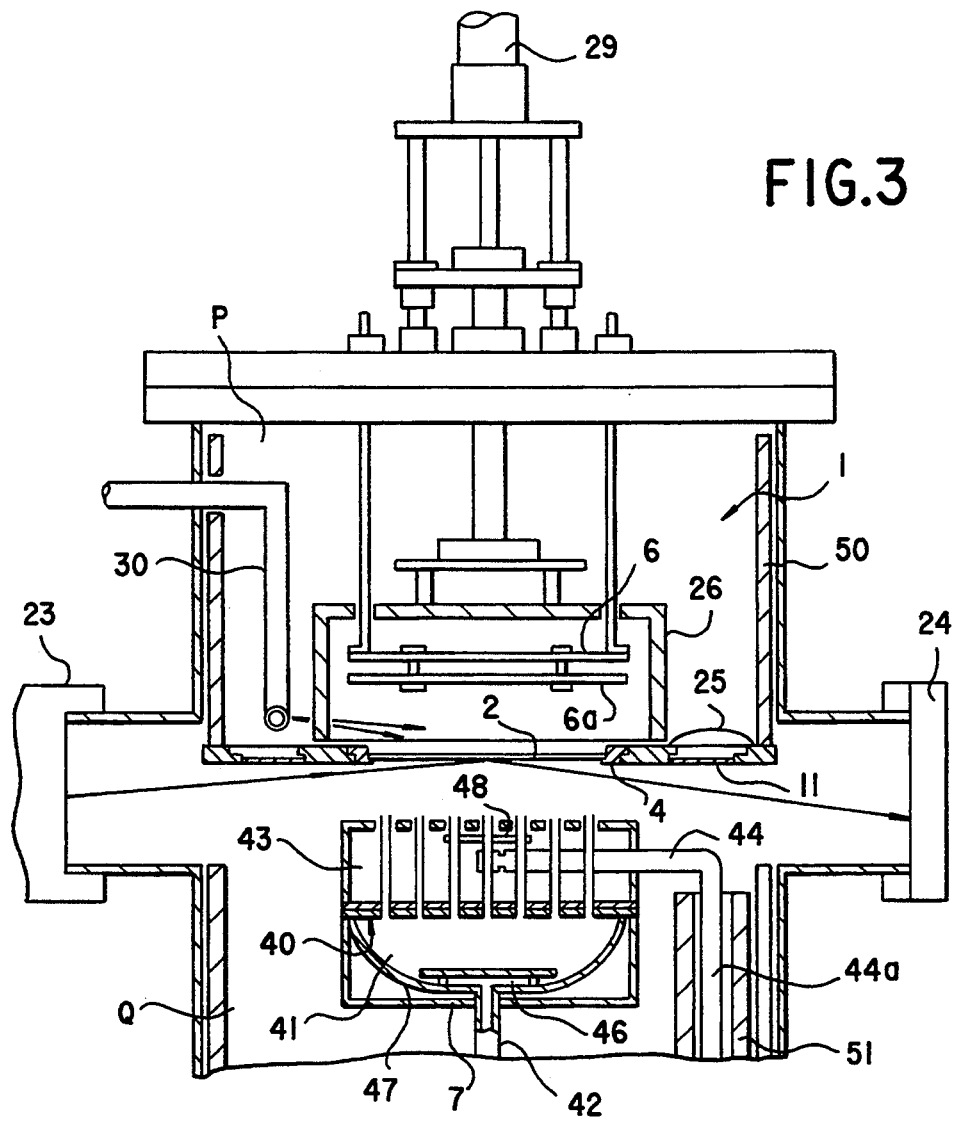
FIG. 3 is an explanatory diagram of the above-mentioned example to which an observation equipment is attached for the observation in place.

In such an apparatus, an observation equipment 23 such as RHEED for observing an film forming state in place is attached to the vacuum chamber 1 so that a reflecting picture image of a locus projected by irradiating electric beam onto the surface of the substrate 2 (the substrate is placed facing downwardly in the drawing) can be seen on a screen (not shown) disposed at the opposite side of the observation equipment as shown in FIG. 3 (a longitudinal sectional view from an different angle from that of FIG. 1). However, in this case, a quartz ring 21 of the above-mentioned separator 11 is of insulating material, so that it tends to be charged by static electricity, and with the existence of such a charged part, the electric beam loses its directivity and swerves from the screen failing to project the locus. For this reason, a thin carbon plate 22 is attached to the bottom of the quartz ring 21 in order to prevent it from being charged in the apparatus so that the static electricity is released to the surrounding wall 1a of the vacuum chamber 1. Also, the carbon ring 20 is earthed with the guiding ring 1b by a tantalum line 25 to release the static electricity to the surrounding wall 1a of the vacuum chamber 1, because the substrate 2 and the carbon ring 20 of the separator 11 are shielded from the surrounding wall 1a of the vacuum chamber 1 with the above-mentioned quartz ring 21 and tend to get charged.

The above-mentioned vacuum chamber 1 is divided into two spaces, a substrate heating space P and a crystal growth space Q by said separator 11, tray 4 and substrate 2. Evacuation pipes 12 and 13 extending from vacuum pumps (not shown) are communicated with the above-mentioned spaces P and Q respectively. Therefore, each of the spaces P and Q can be set at different degree of vacuum. In the substrate heating space P, a heater 6 (such as a plate type heater constructed by forming alternate stripe-form cuttings on a carbon graphite plate and disposing electrodes on both ends) is installed above the substrate and a heat leveling plate 6a is disposed below the heater. They are held by hanging from a ceiling of the vacuum chamber 1. While uniform planar heating is possible with such a heater 6 alone, particularly combination with the above-mentioned heat leveling plate 6a can make the planar heating far more uniform.

Figure 2:
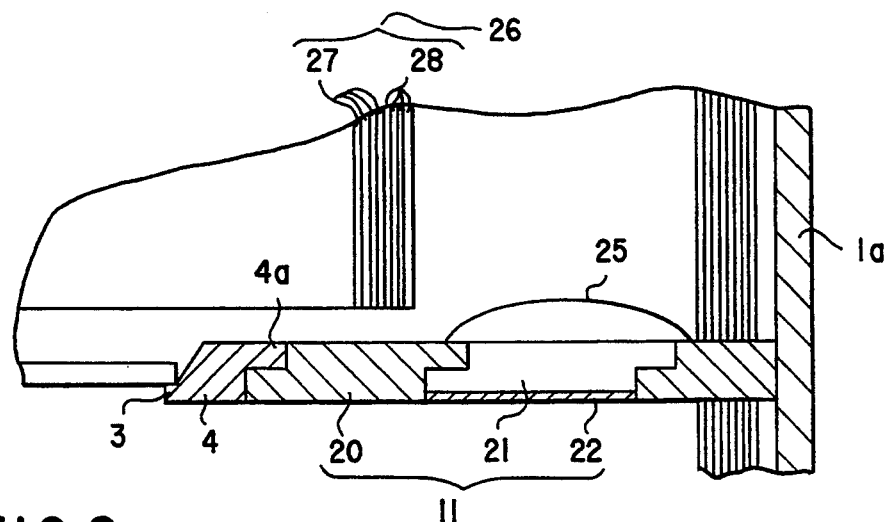
FIG. 2 is an enlarged view of the main part of the above-mentioned example.

The heater 6 and the heat leveling plate 6a are enclosed with a glass-shape heat shielding body 26 with its opening part facing downward. As shown in FIG. 2, the heat shielding body 26 comprises a laminate of eight layer structure wherein inner four layers 27 are made of molybdenum material, and outer four layers 28 are made of stainless steel material. With such structure, a heat retaining property and a heat directivity when heating can be extremely high, so that the heating range of the heater 6 is definite to be able to improve heat efficiency to the substrate 2 drastically.

Further, the upside of the above-mentioned heat shielding body 26 (in FIG. 1) is communicated with a piston rod of a cylinder 29 installed on the top of the vacuum chamber 1 to raise and lower the body 26 at will as indicated by an arrow X. This contrivance is designed for the heat shielding body 26 to avoid a collision with a substrate holding tool (not shown) which slides out or in along the separator 11 from a side on occasions of loading and unloading of the substrate 2, since a lower end of the heat shielding body 26 approaches close to the substrate 11 to raise heat efficiency. On occasions of loading and unloading of the substrate 2, the heat shielding body 26 is elevated to a position indicated with a chain line in FIG. 1 not to interfere the movement of substrate holding tool by operating the cylinder 29.

Also, in the substrate heating space P, a nozzle 30 to inject $H_2$ gas of ordinary temperature toward the side to be heated of the substrate 2 is set, which can inhibit remained material gas around the substrate 2 from excess crystal growth by quenching the substrate 2 immediately after being formed a film to desired thinness on the lower surface of the substrate 2.

Figure 5:
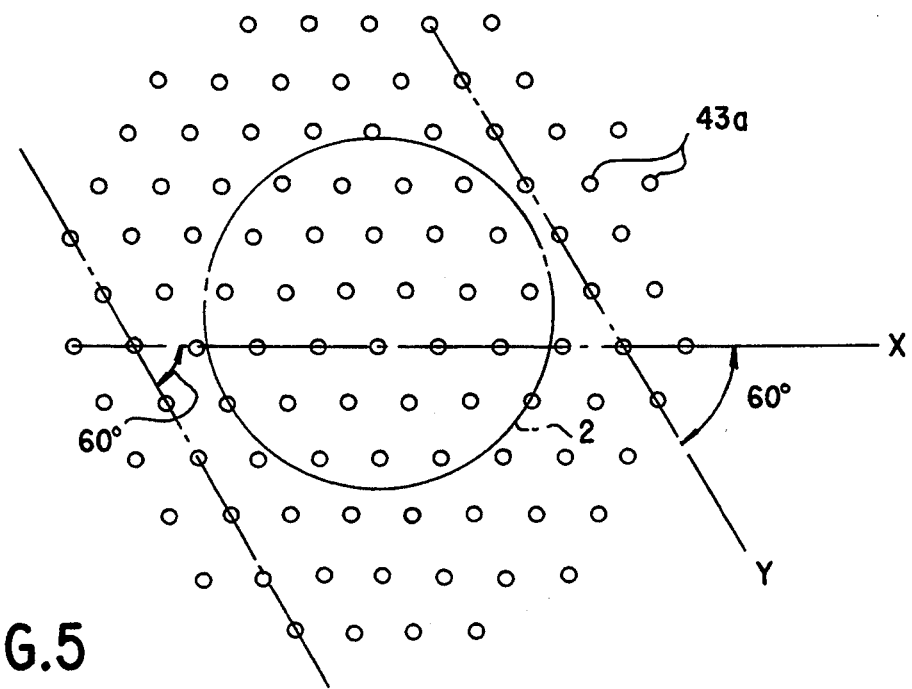
FIG. 5 shows an explanatory diagram of plural openings distributedly formed on the top plate of a manifold.

On the other hand, in the above-mentioned crystal growth space Q, a hollow column manifold 7 is disposed. Inside of the manifold 7 is divided into two chambers, upper and lower, by an intermediate plate 40. The intermediate plate 40 is constructed in two layers of a carbon plate 40a with coating of SiC (silicon carbide) and a molybdenum plate 40b. The molybdenum plate 40b has a high heat shield property to prevent heat from penetrating into the lower chamber of the manifold 7. The lower chamber of the manifold 7 is formed as a second reaction gas dispersing chamber 41 made of stainless steel. A second material gas feeding pipe 42 is communicated with the bottom of the lower chamber 41. And an end of the second material gas pipe 42 is formed as an opening to be a header 46, from which the second material gas is injected outwardly. A hollow hemispheric reflector 47 made of stainless steel is formed at peripheral portion of the header 46 so that the second material gas can ascend smoothly and uniformly spreading along the curve thereof as an arrow shown in FIG. 1. The upper chamber of the manifold 7 is formed as a first reaction gas dispersing chamber 43 made of carbon material with SiC coating and a first material gas feeding pipe 44 made of tantalum material is penetrated into the inside of the upper chamber from its side. An end of the material gas feeding pipe 44 is closed and a plurality of blowout holes 44b are formed at a peripheral wall portion of the end in a circumferential direction with predetermined intervals. Also a horizontal dispersing plate 48 made of tantalum material is disposed at the upper side of said blowout holes 44b. By this dispersing plate, the first material gas ascends uniformly spreading outwardly as shown by a broken line arrow in the drawing. Also, at a ceiling of the above-mentioned the first reaction gas dispersing chamber 43, that is a top plate of the manifold 7, a large number of openings 43a (with the diameter of 4.5 mm) are distributedly formed (35 mm by distance from the surface of the substrate) all around at a regular interval (with the pitch of 18 mm, for example) as shown in FIG. 5. In FIG. 5, openings 43a are formed so that an angle is about sixty degrees where a line X, which links each opening horizontally, and a line Y, which links each opening diagonally, cross. A reference numeral 2 indicates the substrate. Also, in the approximately center of the each opening 43a, ends of a communicating tubes 40c made of tantalum material, which extend upward from a ceiling of the second dispersing chamber 41, are positioned making air gaps between the tubes and the openings' walls of each opening 43a. The first material gas introduced into the first dispersing chamber 43 blows out toward the substrate through the above-mentioned air gaps, and the second material gas introduced into the second dispersing chamber 41 blows out toward the substrate 2 through the communicating tubes 40c. Generally, two kinds of gasses are led to the crystal growth surface of the substrate 2 mixing each other uniformly in a space above the manifold 7.

Further, the present apparatus is contrived to inhibit transferring heat from the heater 6 to the surrounding wall 1a by installing a heat shielding tube 50, which comprises a laminate made of the same materials as that of the above-mentioned heat shielding body 26, at the inner circumference of the surrounding wall 1a of the vacuum chamber 1. Also, a cracker 44a was disposed at the side part of manifold 7 for the purpose of cracking the second material gas. A peripheral part of the cracker 44a is also covered with a heat shielding tube 51 comprising a laminate made of the same materials as that of the above-mentioned heat shielding body 26 to inhibit heat transmission from a material gas to the surrounding wall 1a of the vacuum chamber 1.

By the way, in the present apparatus, since it is difficult to seal contacting parts of the above-mentioned separator 11 and tray 4, and the tray 4 and the substrate 2 completely, the above-mentioned substrate heating space P and crystal growth space Q can not be divided completely. However, since conductance which arises from those slight apertures between two spaces can be controlled within the range of about 0.5 to 5 l/sec although it depends on the diameter and the number of the substrate 2, it is possible to set the difference of the pressure between the lower crystal growth space Q and upper substrate heating space P at 100 to 1000 times when exhaust velocity from each evacuation pipe 12 and 13 is 500 l/sec.

Figure 4:
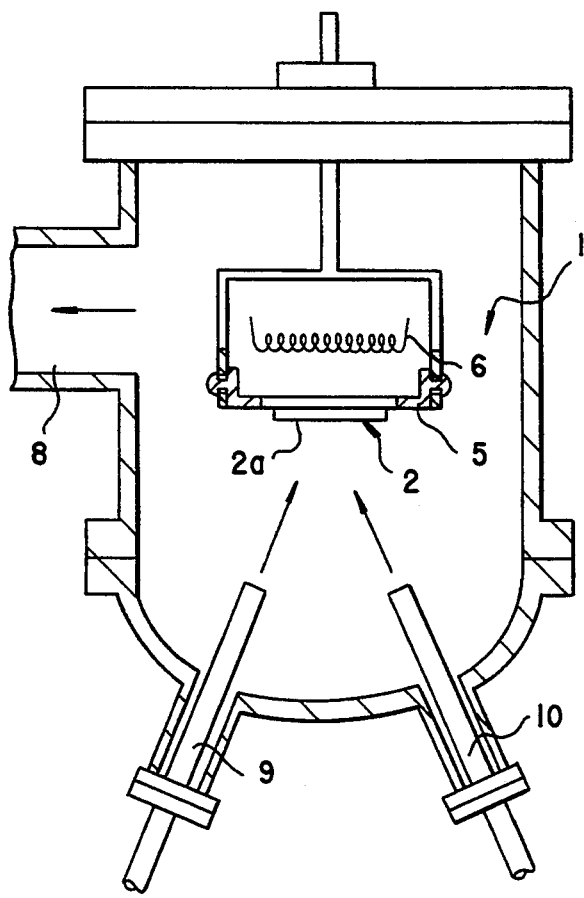
FIG. 4 shows a longitudinal-sectional view of a conventional apparatus for gas MBE source.

Therefore, on the occasion of operating this apparatus, the pressure of Si growth of the lower crystal growth space Q is to be set at vacuum of around $10^{-4}$ Torr which is suitable for crystal growth of Si, pressure of upper substrate heating space P is to be set at vacuum of about $10^{-4}$ to $10^{-6}$ Torr, and then, Si containing gas such as $SiH_4$ and $Si_2H_6$ is to be supplied from the manifold 7 as the first material gas while the prescribed second material gas is supplied. On this condition, Si does not deposit in the substrate heating space P, and reproducibility of crystal growth is well over a long period in the above-mentioned crystal growth space Q. This is the first strong point of the present invention. Also, it is possible that the heat shielding body 26 around the heater 6 raises heat efficiency toward the substrate 2, and decreases electric power consumption for heating drastically in the case of film formation of Si and the like which requires high temperature for film formation. This is the second strong point of the invention. Besides, the quartz ring 21 is used partially as the material of the separator 11 which divides the vacuum chamber 1 into lower and upper spaces, the heat shielding tube 50 is disposed at the inner circumference of the vacuum chamber 1, and the configuration to discharge the substrate 2 and the carbon ring 20 held inside of the quartz ring 21 is installed, so that the outer surface of the vacuum chamber 1 does not get hot from heating of the inside, which is preferable for attaching the observation equipment and the like. Moreover, because the substrate 2 is only put on the tray 4 for installation instead of being pasted directly to the holder (reference numeral 5 in FIG. 4) as it used to be, the present apparatus has an advantage of being capable of conducting treatment to the substrates of larger area, or conducting simultaneous treatment to multiple substrates. Moreover, in the apparatus, since $H_2$ gas at ordinary temperature can be injected from a nozzle 30 to quench the heated surface of the substrate 2 immediately after the film formation, the excess growth of the film can be inhibited, and a film with the desired thinness can be obtained accurately.

In the above-mentioned example, any kind can be employed as the vacuum pump to conduct evacuation of each vacuum space P and Q, but a turbo-molecular pump or a diffusion pump is preferable, for example.

Also, in the above-mentioned example, the tray 4 is communicated with the separator 11, and the substrate 2 is put on the tray 4, but the separator 11 and the tray 4 can be integrated.

Although the substrate 2 is set horizontally in the above-mentioned example, this invention can be applied to MBE process wherein the substrate 2 is set perpendicularly and gas is supplied from the horizontal direction. In this case, the separator 11, the heater 6, the heat leveling plate 6a, the heat shielding body 26, and the like are to be disposed perpendicularly, and the vacuum chamber 1 is to be divided into right and left, in order to evacuate each space separately.

EFFECT OF THE INVENTION

As mentioned hereinbefore, in the apparatus according to the present invention, the vacuum chamber, which is one-room structure conventionally, is divided into two spaces, the substrate heating space and the crystal growth space, and each space can be evacuated separately to be set at the different degree of vacuum. Therefore, in accordance with the present invention, even when the Si based semiconductor, which tends to accumulate Si on the surface of the heater, the heat leveling plate, and the like due to the low vapor pressure, is caused to grow on the substrate, Si based semiconductor can be grown with excellent reproducibility over a long period because deposition of Si can be prevented by setting the degree of vacuum only in the substrate heating space lower than the pressure for the Si growth, while the crystal growth can be conducted in the most suitable condition by setting the degree of vacuum in the crystal space corresponding to the pressure for Si growth. Moreover, heat efficiency of the heating means for the substrate is heightened by enclosing the upside and the circumference of the heating means with the heat shielding body. Therefore, in the film formation of Si and the like that require high temperature for the film formation, electric consumption for heating can be decreased drastically to be able to cut energy cost.

What is claimed is:

1. An apparatus for gas source molecular beam epitaxy comprising:

a vacuum chamber capable of being set at high vacuum;

a substrate installed inside the vacuum chamber;

means for heating the substrate by radiant heat from one side of the installed substrate;

means for supplying gas for formation of a crystal film on the opposite side of the substrate;

a separator set around the substrate which divides the interior of the vacuum chamber into two spaces, a first space for heating the substrate and a second space for crystal formation, wherein said separator includes an inner carbon part contacting said substrate and an outer quartz part contacting the inner wall of said vacuum chamber; and means for separate evacuation of said first and second spaces wherein, the evacuated pressure of said second space being lower than the evacuated pressure of said first space.

* * * * *